US012560645B2

(12) United States Patent
Bornstein

(10) Patent No.: US 12,560,645 B2
(45) Date of Patent: Feb. 24, 2026

(54) SYSTEMS AND METHODS FOR TESTING FUNCTIONALITY AND PERFORMANCE OF A SENSOR AND HUB

(71) Applicant: The ADT Security Corporation, Boca Raton, FL (US)

(72) Inventor: Jeron E. Bornstein, Delray Beach, FL (US)

(73) Assignee: The ADT Security Corporation, Boca Raton, FL (US)

( * ) Notice: Subject to any disclaimer, the term of this patent is extended or adjusted under 35 U.S.C. 154(b) by 0 days.

(21) Appl. No.: 18/593,352

(22) Filed: Mar. 1, 2024

(65) Prior Publication Data

US 2024/0426896 A1     Dec. 26, 2024

Related U.S. Application Data

(62) Division of application No. 18/337,973, filed on Jun. 20, 2023, now Pat. No. 11,953,544.

(51) Int. Cl.
    G01R 31/28          (2006.01)
(52) U.S. Cl.
    CPC ....... G01R 31/2834 (2013.01); G01R 31/287 (2013.01); G01R 31/2874 (2013.01)
(58) Field of Classification Search
    CPC .............. G01D 18/00; G01D 2218/10; G01R 31/2829; G01R 31/2834; G01R 31/287; G01R 31/2874; G06F 11/2215
    See application file for complete search history.

(56) References Cited

U.S. PATENT DOCUMENTS

| | | | |
|---|---|---|---|
| 7,252,230 | B1 | 8/2007 | Sheikh et al. |
| 8,566,648 | B2 * | 10/2013 | Schroeder ........... G06F 11/3672 |
| | | | 717/124 |
| 8,806,280 | B2 * | 8/2014 | Stephenson ........... G06F 3/0488 |
| | | | 715/702 |
| 9,881,510 | B2 * | 1/2018 | Groninger ................ G09B 5/00 |
| 9,898,923 | B1 | 2/2018 | Petrucci |
| 10,657,791 | B2 | 5/2020 | Gerken et al. |
| 10,997,045 | B2 * | 5/2021 | Kyzlink ............. G01R 31/2829 |
| 11,282,031 | B1 | 3/2022 | Butler et al. |
| 11,559,307 | B2 | 1/2023 | Shelton, IV et al. |
| 11,783,687 | B1 | 10/2023 | Bornstein |
| 11,953,544 | B1 * | 4/2024 | Bornstein .......... G01R 31/2834 |

* cited by examiner

*Primary Examiner* — Vinh P Nguyen
(74) *Attorney, Agent, or Firm* — Weisberg I.P. Law, P.A.

(57)          ABSTRACT

A system for testing a sensor and a hub is provided. The system includes a testing control device and a sensor testing device. The testing control device is configured to select a testing profile based at least in part on the sensor, and transmit a testing initiation signal based at least in part on the testing profile. The sensor testing device is configured to perform testing of the sensor and the hub in response to the testing initiation signal, the testing including rotating the sensor along at least one axis based at least in part on the testing profile, and transmit test data to the testing control device based at least in part on the testing of the sensor and the hub. The testing control device is configured to receive the test data from the sensor testing device.

20 Claims, 9 Drawing Sheets

SYSTEMS AND METHODS FOR TESTING FUNCTIONALITY AND PERFORMANCE OF A SENSOR AND HUB

CROSS-REFERENCE TO RELATED PATENT APPLICATION

This application is a Divisional of and claims priority to U.S. Utility patent application Ser. No. 18/337,973, filed on Jun. 20, 2023, now U.S. Pat. No. 11,953,544, entitled SYSTEMS AND METHODS FOR TESTING FUNCTION-ALITY AND PERFORMANCE OF A SENSOR AND HUB, the entirety of which is incorporated herein by reference.

TECHNICAL FIELD

The present technology is generally related to sensor orientation and performance testing.

BACKGROUND

A variety of sensors or other premises devices may be deployed in a premises, each potentially placed in distinct locations or positions depending on the specific require-ments of the installation. Such sensors typically communi-cate wirelessly with one another and/or with one or more hub devices. These sensors may be deployed in diverse arrangements and different operational environments.

BRIEF DESCRIPTION OF THE DRAWINGS

A more complete understanding of the present disclosure, and the attendant advantages and features thereof, will be more readily understood by reference to the following detailed description when considered in conjunction with the accompanying drawings wherein.

DETAILED DESCRIPTION

As used herein, relational terms, such as "first" and "second," "top" and "bottom," and the like, may be used solely to distinguish one entity or element from another entity or element without necessarily requiring or implying any physical or logical relationship or order between such entities or elements. The terminology used herein is for the purpose of describing particular embodiments only and is not intended to be limiting of the concepts described herein. As used herein, the singular forms "a", "an" and "the" are intended to include the plural forms as well, unless the context clearly indicates otherwise. The terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

In embodiments described herein, the joining term, "in communication with" and the like, may be used to indicate electrical or data communication, which may be accom-plished by physical contact, induction, electromagnetic radiation, radio signaling, infrared signaling or optical sig-naling, for example. Multiple components may interoperate and modifications and variations are possible to achieve electrical and data communication.

In some embodiments described herein, the term "coupled," "connected," and the like, may be used herein to indicate a connection, although not necessarily directly, and may include wired and/or wireless connections.

Figure 1:
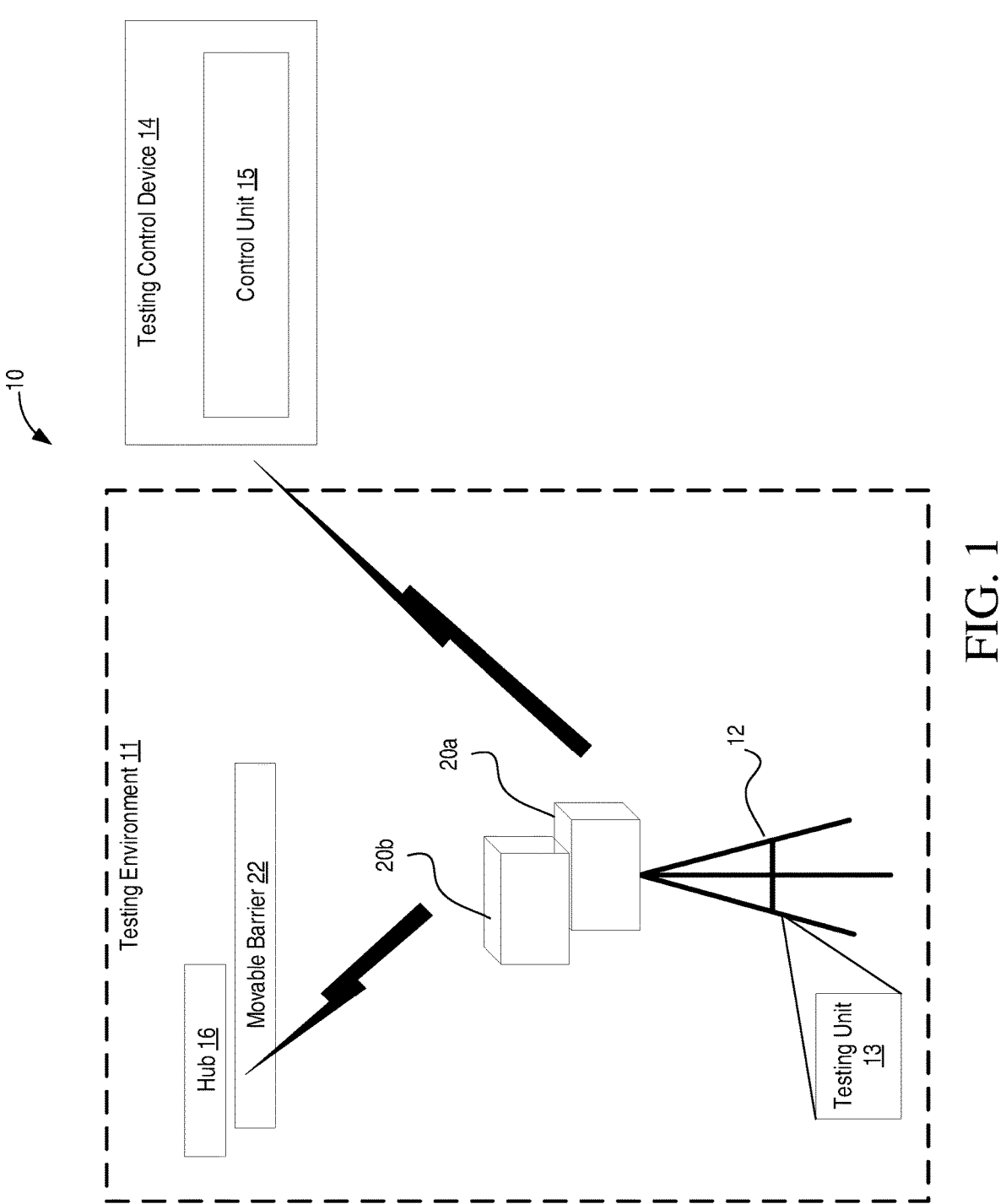
FIG. 1 is a schematic diagram of an example of a system according to some embodiments of the present disclosure.

Referring now to the drawing figures, in which like elements are referred to by like reference numerals, there is shown in FIG. 1 is a schematic diagram of a system 10. System 10 may include a testing environment 11, a sensor testing device 12 including testing unit 13, a testing control device 14 including control unit 15, a hub 16, and one or more sensors 20a, 20b, etc. (collectively, sensor 20), which may correspond to a hub 16 and/or sensors 20 being tested by sensor testing device 12 and/or testing control device 14 in a testing environment 11. Sensor testing device 12 may be configured to receive, transmit, process, and/or control test signals for hub 16 and/or sensor 20, as controlled by testing control device 14. Testing control device 14 may be con-figured to receive, transmit, and/or process test data related to sensor 20 and/or hub 16. System 10 may further include one or more movable barriers 22, which may simulate a wall, window, or other type of barrier(s) typically encoun-tered in a premises environment, and which may be movable and/or adjustable, e.g., using motorized wheels controlled by testing control device 14, on a preconfigured track, and/or by a human operator.

In some embodiments, sensor testing device 12 may be a mechanical device that includes sufficient hardware, com-puting power, and/or software to perform one or more sensor 20 and/or hub 16 testing techniques described herein. For example, sensor testing device 12 may include a turret or similar structure(s) to which sensor 20 may be mounted and which is capable of rotating and/or moving sensor 20 (and/or hub 16) along one or more axes, e.g., with respect to objects or structures in a testing environment 11. Further, in some embodiments, sensor testing device 12 may be configured to communicate, via a wired and/or wireless connection, with one or more of the sensors 20 being tested.

In some embodiments, testing control device 14 may be a computing device that performs the various testing control techniques described herein. In various embodiments, the testing control device 14 may be provided by a computing environment that includes one or more computing devices. The computing environment may operate as an elastic computing environment for which the allotted capacity of computing-related resources may vary over time. The computing environment may also include and/or be operated as one or more virtualized computer instances that perform various functionality described herein.

In one or more embodiments, sensor testing device 12, testing control device 14, hub device 16, sensor 20, and/or movable barrier 22 may be configured to communicate with each other via one or more communication links and protocols, e.g., to communicate test data, control data, etc., which may be communicated in various formats.

In some embodiments, hub 16 may correspond to one or more of a premises security device, a premises control panel, a security control panel, a base station, an access point, or any other networking and/or computing device which may be configured to receive signaling (e.g., wireless signaling) from one or more sensors 20, which may be configured to measure radio channel conditions, signal quality, etc., between the hub 16 and the one or more sensors 20, and which may be configured to be tested, either separately or in conjunction with one or more sensors 20.

In some embodiments, sensors 20a, 20b, etc. may correspond to one or more of a variety of sensor types used, for instance, in a premises security system, premises automation system, etc. For example, sensors 20a, 20b, etc., may include various life and/or safety related sensors, such as motion sensors, fire sensors, carbon monoxide sensors, flooding sensors, contact sensors, door sensors, window sensors, proximity sensors, light sensors, audio sensors, etc., among other sensor types. In some embodiments, a first sensor 20a may include one or more sensor sub-modules. For example, a sensor 20a which is for sensing whether a door is open or shut may include a first sub-module which is to be mounted on the door (or a structure simulating a door, such as a movable panel or turret), and a second sub-module which is to be mounted on the door frame (or a structure simulating a door frame, such as a fixed panel), such that the first sub-module and second sub-module are in relatively close proximity when the door is shut, and are relatively more spatially separated when the door is open.

In some embodiments, sensor testing device 12 may be at least temporarily co-located (e.g., in the same premises, in testing environment 11, etc.) with testing control device 14. In other embodiments, sensor testing device 12 may be remote and/or separate from testing control device 14, e.g., sensor testing device 12 may be located in a factory or development setting where the testing is performed (e.g., via a direct physical connection and/or a remote and/or wireless connection), while the testing control device 14 may be located in a separate facility, in a cloud computing node, etc. In some embodiments, at least part of the testing control device 14 may be in the same premises, device, housing, etc., as the sensor testing device 12.

Figure 2:
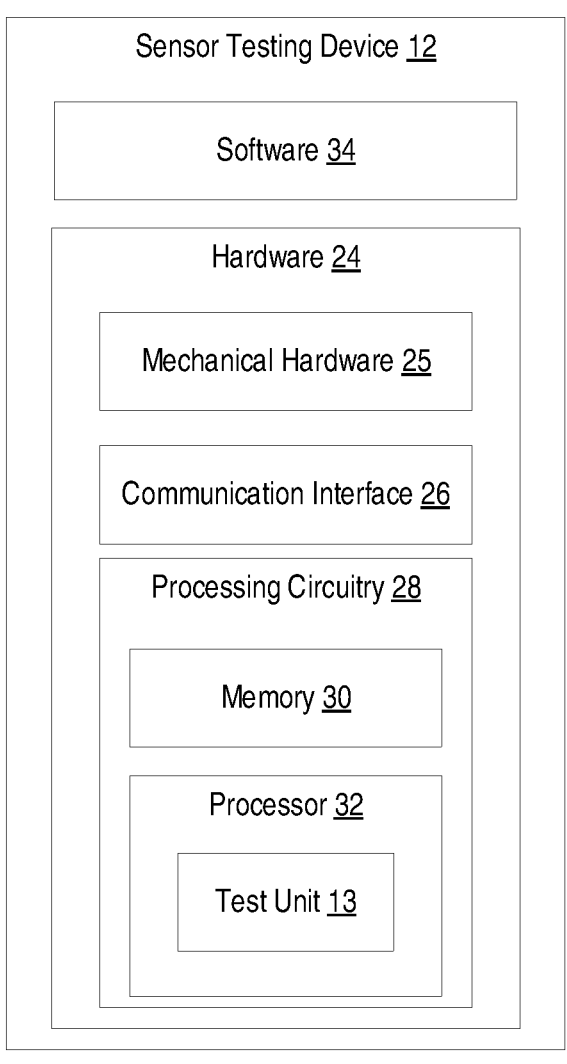
FIG. 2 is a block diagram of an example sensor testing device in the system of FIG. 1 according to some embodi-ments of the present disclosure.

FIG. 2 shows an example sensor testing device 12, which may comprise hardware 24, including mechanical hardware 25, communication interface 26 and processing circuitry 28. The processing circuitry 28 may include a memory 30 and a processor 32. In addition to, or instead of a processor, such as a central processing unit, and memory, the processing circuitry 28 may comprise integrated circuitry for processing and/or control, e.g., one or more processors, processor cores, field programmable gate arrays (FPGAs) and/or application specific integrated circuits (ASICs) adapted to execute instructions. The processor 32 may be configured to access (e.g., write to and/or read from) the memory 30, which may comprise any kind of volatile and/or nonvolatile memory, e.g., cache, buffer memory, RAM, read-only memory (ROM), optical memory and/or erasable programmable read-only memory (EPROM), flash memory, etc.

Mechanical hardware 25 of sensor testing device 12 may include various components for mounting, moving, and rotating sensor 20, such as linear actuators, motors, gears, servos, sliders, and rails, as well as a mounting mechanism for affixing, mounting, gripping, etc., sensor 20 (and/or one or more sub-modules 21a, 21b, etc.). The mounting mechanism may comprise clamps, brackets, a turret structure, and/or other suitable attachment means, ensuring secure and stable attachment of sensor 20 to the sensor testing device 12. Additionally, the mechanical hardware 25 may include sensors or measuring devices, such as accelerometers, gyroscopes, or cameras, for accurately monitoring the position and orientation of sensor 20 during the testing process. These components work in conjunction to provide precise control over the movement and orientation of sensor 20, enabling comprehensive testing and calibration of the sensor under various conditions. For example, in some embodiments, the angle of rotation, position, etc., may be controllable by specifying a number of degrees.

Communication interface 26 may comprise and/or be configured to support wired and/or wireless communication between sensor testing device 12 and any other component of system 10, such as testing control device 14 and/or one or more sensors 20.

Sensor testing device 12 may further include software 34 stored internally in, for example, memory 30 or stored in external memory (e.g., database, storage array, network storage device, etc.) accessible by sensor testing device 12 via an external connection. The software 34 may be executable by the processing circuitry 28. The processing circuitry 28 may be configured to control any of the methods and/or processes described herein and/or to cause such methods, and/or processes to be performed, e.g., by sensor testing device 12. Processor 32 corresponds to one or more processors 32 for performing sensor testing device 12 functions described herein. The memory 30 is configured to store data, programmatic software code and/or other information described herein. In some embodiments, the software 34 may include instructions that, when executed by the processor 32 and/or processing circuitry 28, causes the processor 32 and/or processing circuitry 28 to perform the processes described herein with respect to device 12. For example, processing circuitry 28 may include testing unit 13 configured to perform one or more sensor testing device 12 functions as described herein, such as determining test control signals for sensor 20, controlling mechanical hardware 25 to achieve a specified position, angle, rotational speed, etc., of the sensor 20, etc.

Figure 3:
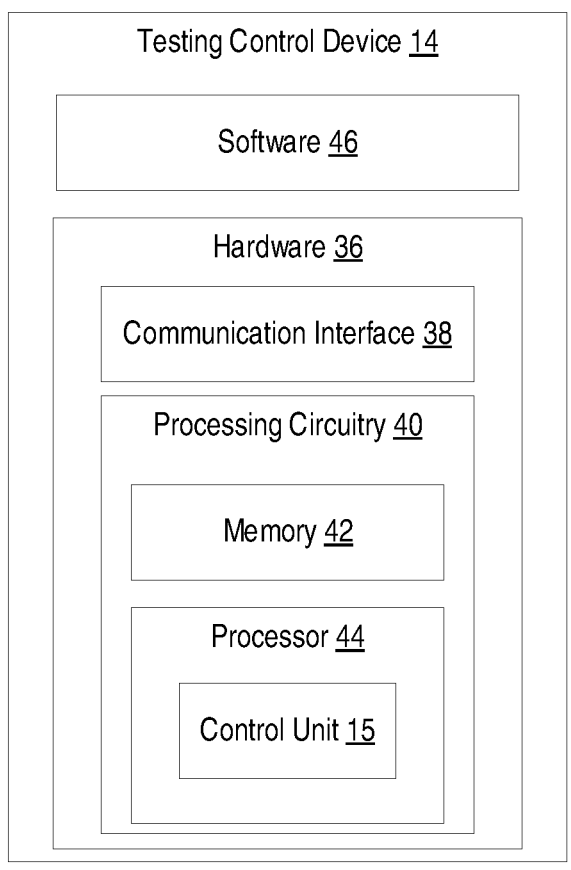
FIG. 3 is a block diagram of an example testing control device in the system of FIG. 1 according to some embodi-ments of the present disclosure.

FIG. 3 is a block diagram illustrating an example testing control device 14, which may comprise hardware 36, including communication interface 38 and processing circuitry 40. The processing circuitry 40 may include a memory 42 and a processor 44. In addition to, or instead of a processor, such as a central processing unit, and memory, the processing circuitry 40 may comprise integrated circuitry for processing and/or control, e.g., one or more processors, processor cores, FPGAs and/or ASICs adapted to execute instructions. The processor 44 may be configured to access (e.g., write to and/or read from) the memory 42, which may comprise any kind of volatile and/or nonvolatile memory, e.g., cache, buffer memory, RAM, ROM, optical memory and/or EPROM.

Communication interface 38 may comprise and/or be configured to support communication between testing control device 14 and any other component of system 10, such as one or more sensors 20, hub 16, movable barrier 22, etc. In some embodiments, for example, testing control device 14 may be remote from sensor testing device 12, and may communicate, e.g., via one or more intermediate networks, such as an intranet or the Internet.

Testing control device 14 may further include software 46 stored internally in, for example, memory 42 or stored in external memory (e.g., database, storage array, network storage device, etc.) accessible by testing control device 14 via an external connection. The software 46 may be executable by the processing circuitry 40. The processing circuitry 40 may be configured to control any of the methods and/or processes described herein and/or to cause such methods, and/or processes to be performed, e.g., by testing control device 14. Processor 44 corresponds to one or more processors 44 for performing testing control device 14 functions described herein. The memory 42 is configured to store data, programmatic software code and/or other information described herein. In some embodiments, the software 46 may include instructions that, when executed by the processor 44 and/or processing circuitry 40, causes the processor 44 and/or processing circuitry 40 to perform the processes described herein with respect to testing control device 14. For example, processing circuitry 40 may include control unit 15 configured to perform one or more testing control device 14 functions as described herein, such as controlling and monitoring the testing process of hub 16 and/or sensor 20, collecting test data, providing a user interface for receiving control inputs and/or displaying test results, etc.

Figure 4:
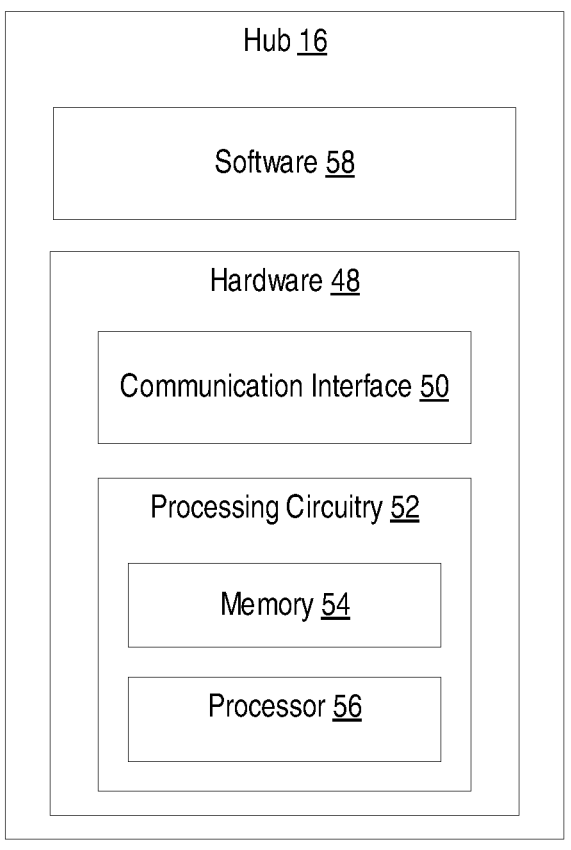
FIG. 4 is a block diagram of an example hub device in the system of FIG. 1 according to some embodiments of the present disclosure.

FIG. 4 illustrates an example hub 16, which may comprise hardware 48, including communication interface 50 and processing circuitry 52. The processing circuitry 52 may include a memory 54 and a processor 56. In addition to, or instead of a processor, such as a central processing unit, and memory, the processing circuitry 52 may comprise integrated circuitry for processing and/or control, e.g., one or more processors, processor cores, FPGAs and/or ASICs adapted to execute instructions. The processor 56 may be configured to access (e.g., write to and/or read from) the memory 54, which may comprise any kind of volatile and/or nonvolatile memory, e.g., cache, buffer memory, RAM, ROM, optical memory and/or EPROM.

Communication interface 50 may comprise and/or be configured to support communication between hub 16 and any other component of system 10. Communication interface 50 may include at least a radio interface configured to send and/or receive signaling with one or more sensors 20 being tested, and/or any other component of system 10. The radio interface may be formed as, or may include, for example, one or more RF transmitters, one or more RF receivers, and/or one or more RF transceivers. Communication interface 50 may include a wired communication interface, such as an Ethernet interface, configured to set up and maintain a wired connection with any component of system 10.

Hub 16 may further include software 58 stored internally in, for example, memory 54 or stored in external memory (e.g., database, storage array, network storage device, etc.) accessible by hub 16 via an external connection. The software 58 may be executable by the processing circuitry 52. The processing circuitry 52 may be configured to control any of the methods and/or processes described herein and/or to cause such methods, and/or processes to be performed, e.g., by hub 16. Processor 56 corresponds to one or more processors 56 for performing hub 16 functions described herein. The memory 54 is configured to store data, programmatic software code and/or other information described herein. In some embodiments, the software 58 may include instructions that, when executed by the processor 56 and/or processing circuitry 52, cause the processor 56 and/or processing circuitry 52 to perform the processes described herein with respect to hub 16. For example, processing circuitry 52 may be configured to perform one or more hub 16 functions as described herein, such as communicating with sensor 20, receiving test signals from sensor testing device 12 and/or testing control device 14, measuring signals from sensor 20, etc.

Figure 5:
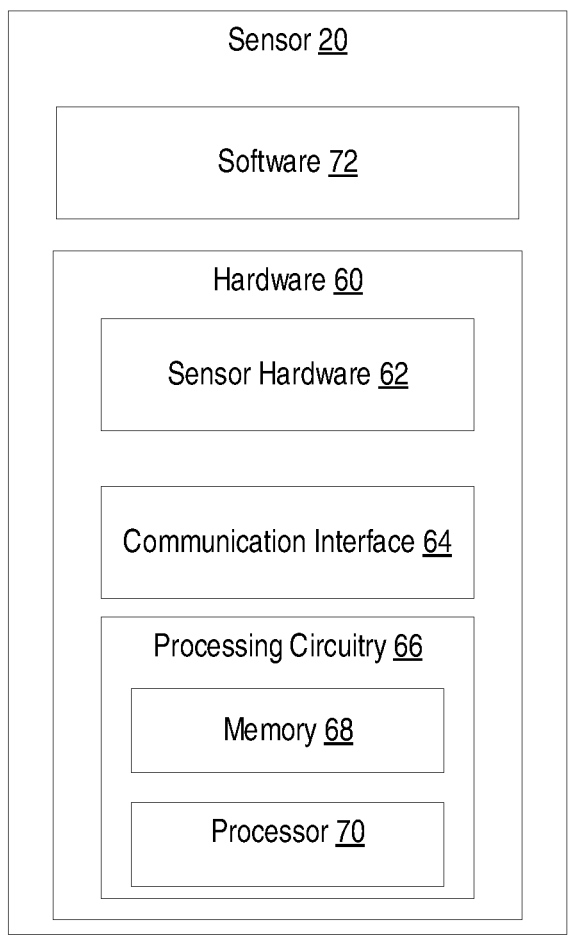
FIG. 5 is a block diagram of an example sensor device in the system of FIG. 1 according to some embodiments of the present disclosure.

FIG. 5 shows an example sensor 20, which may comprise hardware 60, including sensor hardware 62, communication interface 64, and processing circuitry 66. The processing circuitry 66 may include a memory 68 and a processor 70. In addition to, or instead of a processor, such as a central processing unit, and memory, the processing circuitry 66 may comprise integrated circuitry for processing and/or control, e.g., one or more processors, processor cores, FPGAs and/or ASICs adapted to execute instructions. The processor 70 may be configured to access (e.g., write to and/or read from) the memory 68, which may comprise any kind of volatile and/or nonvolatile memory, e.g., cache, buffer memory, RAM, ROM, optical memory and/or EPROM.

Sensor hardware 62 may comprise one or more components, modules, etc., for performing one or more sensor functions, such as motion detection, water detection, chemical detection, light detection, audio detection, biometric detection, etc.

Communication interface 64 may comprise and/or be configured to support communication between sensor 20 and any other component of system 10. Communication interface 64 may include at least a radio interface configured to set up and maintain a wireless connection with hub 16, other sensors 20 (and/or sensor sub-modules), and/or any other component of system 10. The radio interface may be formed as, or may include, for example, one or more RF transmitters, one or more RF receivers, and/or one or more RF transceivers. Communication interface 64 may include a wired communication interface, such as an Ethernet interface, configured to set up and maintain a wired connection with any component of system 10.

Sensor 20 may further include software 72 stored internally in, for example, memory 68 or stored in external memory (e.g., database, storage array, network storage device, etc.) accessible by sensor 20 via an external connection. The software 72 may be executable by the processing circuitry 66. The processing circuitry 66 may be configured to control any of the methods and/or processes described herein and/or to cause such methods, and/or processes to be performed, e.g., by sensor 20. Processor 70 corresponds to one or more processors 70 for performing sensor 20 functions described herein. The memory 68 is configured to store data, programmatic software code and/or other information described herein. In some embodiments, the software 72 may include instructions that, when executed by the processor 70 and/or processing circuitry 66, cause the processor 70 and/or processing circuitry 66 to perform the processes described herein with respect to sensor 20. For example, processing circuitry 66 may be configured to perform one or more sensor 20 functions as described herein, such as responding to test signals from hub 16, from sensor testing device 12, etc., controlling sensor hardware 62, etc.

In some embodiments, sensor testing device 12 may be designed as a tripod-style device. For example, the sensor testing device 12 may include three or more adjustable legs, providing stability and adaptability to different surfaces or testing conditions. At the top of the tripod, a mounting element may be used for affixing one or more sensors 20 securely. The mounting element may include a variety of mounting mechanisms, such as clamps, brackets, or other suitable attachment means, ensuring a stable and secure connection between the sensor 20 and the sensor testing device 12.

In some embodiments, mechanical hardware 25, integrated within the tripod-style device, is responsible for rotating and/or positioning the sensor(s) 20, for example, according to one or more configurations and/or testing profiles. A testing profile may define a series of movements, rotations, and other manipulations, as controlled by the testing control device 14 and/or sensor testing device 12 and/or hub 16. For example, in some embodiments, the testing control device 14 generates test signals for the sensor(s) 20 in accordance with a testing profile, where the testing profile may be associated with a sensor type (e.g., a model number, a product category, etc.) corresponding to sensor 20, measures and/or receives responses, such as measuring signal output, measuring signaling received at hub 16, measuring indications, etc., generated by the sensor(s) 20, and/or monitoring/measuring communication between the sensor(s) 20 and the hub 16, e.g., located in the environment 11.

In some embodiments, the mechanical hardware 25 may include motors, actuators, and gears for precise control over the rotation and positioning of the sensor(s) 20. Additionally, the mechanical hardware 25 may comprise sensors or measuring devices, such as accelerometers, gyroscopes, or cameras, for accurately monitoring the position and orientation of sensor 20 during the testing process.

In some embodiments, a tripod-style sensor testing device 12 allows for easy setup and mobility while offering versatility in testing various sensor types and orientations. This design enables comprehensive testing and calibration of the sensor(s) 20 under a wide range of conditions. Although a tripod-style device is described in some embodiments, other configurations and arrangements of sensor testing device 12 may be used without deviating from the scope of the present disclosure.

In some embodiments, movable barrier 22 may be made of various materials, such as wood, drywall, concrete, metal, glass, and/or plastic, to emulate different types of walls or barriers found in environments in which sensors 20 may be installed for an end user. The panels may be adjustable in size, shape, and position, allowing for the creation of a diverse range of testing configurations. This versatility enables the testing control device 14 to assess the sensors' 20 performance under multiple environmental conditions, including the presence of obstructions and different types of materials that may impact signal transmission and reception.

In some embodiments, the movable barrier 22 may be mounted on mobile platforms or integrated with actuators, enabling them to be moved, rotated, or repositioned during the testing process, e.g., in accordance with a testing profile/configuration, and/or as directed by testing control device 14. This dynamic modification of the environment 11 provides a comprehensive evaluation of the sensors 20 and/or hub 16 capabilities in adapting to changing conditions.

The testing control device 14 may control the positioning and movement of the sensor testing device 12 and/or movable barrier 22, as well as record the resulting sensor performance data. This data can be used to refine the sensor calibration, optimize the communication protocols between the sensors 20 and hub 16, and enhance the overall system performance in the environment 11. In this manner, the sensor testing setup offers a highly adaptable and customizable testing platform for evaluating and improving the performance of sensor systems.

The sensor performance data collected during the testing process can be used to identify potential weaknesses or vulnerabilities in the sensor systems. This information can guide the development of more robust sensor designs, communication protocols, or signal processing techniques, ultimately resulting in improved overall system performance and reliability in real-world environments.

In addition to testing sensors 20, a variety of other devices (e.g., keypads, alarms, biometric devices, communication devices, user equipment devices, user interface devices, etc.) may be mounted on and/or tested by the sensor testing device 12 using the techniques described herein. Moreover, in addition to testing hubs 16, a variety of types of devices (e.g., control panels, smartphones, access points, network nodes, base stations, etc.) may be tested using the techniques described herein.

In some embodiments, the sensor testing device 12 may be a turret-shaped device with a vertically-oriented, 360-degree rotating base that facilitates precise sensor 20 positioning, e.g., to the nearest 0.1125 degrees. The precision may be limited by the mechanical hardware 25, for example, a motor in the sensor testing device 12 may be configurable in increments of 0.1125 degrees, or some other increment amount, according to its hardware limitations. A horizontally-oriented rotating platform, attached to the rotating base, may enable the sensor testing device 12 to adjust the sensor 20 at an accurate angle in both the vertical and horizontal planes. The sensor testing device 12 communication interface 26 may be configured for maintaining various connections with other entities of system 10, such as through Wi-Fi, Bluetooth, ZigBee, USB, Serial, I2C, Ethernet, etc. protocols. The sensor testing device 12 and/or testing control device 14 may be configured to log and/or exhibit the recorded testing data, e.g., on a graphical dashboard or other user interface, which may provide a user with testing information such as Received Signal Strength Indicator (RSSI), battery life, power consumption, and other pertinent data, as discussed herein. Thus, embodiments of the present disclosure may enable a comprehensive testing cycle for all orientations of sensor 20 devices or other RF devices against a host device (e.g., hub 16), thus reducing or eliminating the need for manual testing, and reducing the risk of human errors. Embodiments may be capable of performing, e.g., 10,000 trigger cycles, across a variety of orientations, over a variety of time periods, e.g., within a 24-hour period.

For example, in an embodiment where the sensor testing device 12 is a turret with two rotating platforms, the sensor testing device 12 may connect to the hub 16 and/or testing control device 14, and the two rotating platforms may be driven by 1.8-degree stepper motors set in a $1/16^{th}$ microstep configuration. This arrangement may ensure that each step accurately delivers a resolution, e.g., of 0.1125 degrees. With this setup, the sensor testing device 12 may rotate a sensor 20 to any desired position, trigger the sensor 20, confirm successful message transmission (e.g., with hub 16), log all relevant performance parameters, e.g., RF performance, battery performance, power consumption, temperature, etc., and subsequently report this information to the testing control device 14 for presenting the information on a graphical dashboard or other user interface means.

In various embodiments, sensor 20 activation methods (e.g., for simulating the sensor 20 activation during testing)

may vary depending on the sensor 20 type, which may be defined, e.g., in a testing profile by testing control device 14. For instance, door/window sensors 20 may be activated either by operating a physical magnet or by toggling a stationary electromagnet on/off via low/high side MOSFET gate. Some sensors 20, for example, may require a 3.3 volt or 5 volt signal, or a switch from normally open to closed circuit, to be triggered. In some embodiments, a testing process may comprise continuous rotation (or a number of rotations according to a discrete number of steps, angles, degrees, increments, etc.) of the sensors 20 to a new position, sensor 20 triggering, monitoring the output of the sensor 20 and/or hub 16, logging all pertinent information, and graphically displaying the results.

Figure 6:
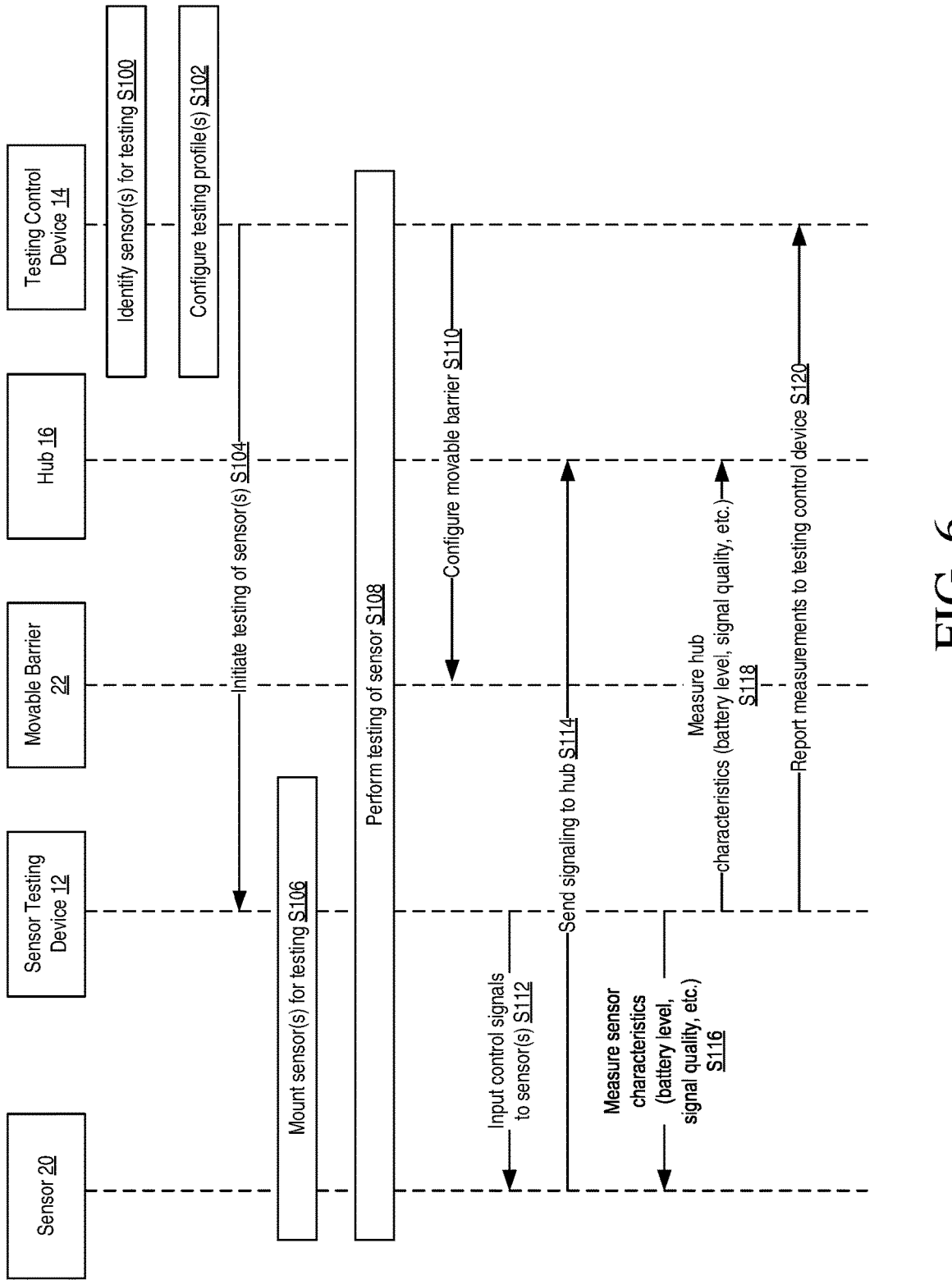
FIG. 6 is a signaling diagram illustrating an example testing process according to some embodiments of the present disclosure.

FIG. 6 is a signaling diagram illustrating an example testing procedure according to some embodiments of the present disclosure.

Step S100: In this step, the testing control device 14 identifies and determines information for a sensor 20 and/or hub 16 for testing. This can be performed manually by a user selecting a sensor 20 and/or hub 16 through a user interface of the testing control device 14 or another connected device, such as a smartphone or hub 16. Alternatively, the identification can be performed automatically using methods like computer vision, RFID tags, or barcodes (e.g., printed on sensor 20). The identified information may include details like sensor type, hub type, model number, serial number, product family, etc.

Step S102: In this step, the testing control device 14 configures and/or determines and/or selects a testing profile for the sensor 20 and/or hub 16. The testing profile may be based on the identified model number, product type, or vendor information (e.g., a plurality of testing profiles may be stored in testing control device 14, each profile being mapped to a sensor 20 type, for example). The testing profiles may be different for various sensor types, different sensor manufacturers, etc. Some aspects of the profile may be manually input by a human operator, while other aspects may be automatically determined based on previous testing parameters, default parameters, or other means. The testing profiles may define movement patterns or sequences for sensor testing device 12, sensors 20, movable barrier(s) 22, and/or hub 16, and/or may define signal patterns, test data, control signals, etc., for sensor testing device 12, sensors 20, movable barrier(s) 22, and/or hub 16.

Step S104: The testing control device 14 may signal to the sensor testing device 12 to initiate testing of sensors 20. In some embodiments, an initiation signal may also be sent to one or more of sensor 20, hub 16, sensor testing device 12, and/or movable barrier 22. The initiation signal may include and/or indicate one or more testing profiles, configurations, settings, parameters, etc.

Step S106: The sensor 20 is mounted to the sensor testing device 12. This may be performed manually by a testing operator or automatically by a robotic arm or other auto-mated means controlled by the testing control device 14, for example. The testing control device 14 and/or sensor testing device 12 may use computer vision, RFID tags, QR codes, or other similar means to identify and select a sensor 20 for testing, for example, by picking it from a bin or cabinet containing sensors 20 to be tested.

Step S108: Based on the configured testing profile (e.g., as indicated in the initiation signal), the sensor testing device 12 and/or testing control device 14 initiate the testing of sensor 20 and/or hub 16 in environment 11. This step may include performing movement patterns, positions, signaling, measurement, and/or recording to evaluate the sensor's 20 performance, verify proper operation, and identify faults. The testing process may assess various aspects such as the sensor's 20 response to different conditions, its adaptability, communication with the hub 16, and overall performance in the simulated environment 11. For example, hub 16 may be configured to measure signals received from sensor 20, and report the measurements (e.g., test data) to sensor testing device 12 and/or testing control device 14.

For example, the sensor 20 being tested may be a door sensor which includes two submodules, as described above. These submodules may be configured to work in tandem, with a first submodule typically being placed on a door and a second submodule on a door frame. To accurately simulate the typical operating conditions of such a door sensor, one or both submodules are mounted onto the sensor testing device 12.

During the testing process, the sensor testing device 12 may move the sensor 20 submodules around within the environment 11 as well as with respect to one another. In the example of a door sensor 20, this movement may be configured to simulate the relative motion between a door and its frame during opening and closing. Mechanical hardware 25 of the sensor testing device 12 may be used to control the relative positions and orientations of the sensor submodules, providing a variety of test scenarios.

During the testing process, the testing control device 14 and/or sensor testing device 12 and/or hub 16 may generate test signals, monitor the communication between sensors 20 and/or sensor submodules and/or hub 16. For example, in the case of a door sensor 20, the test signals may include a series of open and close events, mimicking the typical use of a door. For another type of sensor 20, such as a flood sensor 20, the test signals may simulate a flood event, e.g., by applying a predetermined voltage to an input of a sensor 20 which may correspond to and/or simulate the presence of water. The testing control device 14 measures and analyzes the resulting signaling between the sensors 20, submodules, and/or hub 16 to assess the performance of the door sensor under various conditions.

In another example embodiment, the sensor 20 being tested is a flood (water) sensor designed to detect the presence of water and trigger an alarm or notification when water is detected. To accurately simulate the typical operating conditions of such a flood sensor, the testing process includes an additional step whereby the testing control device 14 and/or the sensor testing device 12 generate signals that simulate or otherwise trigger the sensor 20. These signals may involve simulating the presence of water, sending a voltage signal to a pin input on the sensor 20, or using other methods to activate the sensor 20 as if water were present.

During the testing process, the sensor 20 may be moved around and/or rotated within the environment 11 using the mechanical hardware 25 of the sensor testing device 12. This movement simulates various installation positions and orientations that a flood sensor 20 might encounter in real-world applications.

As the sensor 20 is moved and/or rotated, the testing control device 14 monitors the resulting outputs, such as communication between the sensor 20 and hub 16, or outputs/indications from the sensor 20 itself. The testing control device 14 analyzes these outputs to detect any faults or inconsistencies in the sensor 20's performance, such as false positives or failure to detect the simulated presence of water.

In another example, similar to the flood sensor example, the sensor 20 being tested is a motion sensor designed to detect movement within a specific area and trigger an alarm or notification when motion is detected. To accurately simulate the typical operating conditions of such a motion sensor, the testing process may include an additional step whereby the testing control device 14 and/or the sensor testing device 12 generate electrical signals, such as a voltage signal, which either emulate motion or directly trigger the motion sensor 20.

In this example, the motion sensor 20 may include a debugging or testing pin input specifically configured for being triggered by a particular signal or signal pattern. This feature allows the testing control device 14 to activate the motion sensor without the need for actual movement within the sensor's field of view. In other embodiments, additional devices may be provided in environment 11 which simulate movement, e.g., of persons, pets, etc.

For example, in some embodiments, during the testing process, the motion sensor 20 is moved around and/or rotated within the environment 11 using the mechanical hardware 25 of the sensor testing device 12. This movement simulates various installation positions and orientations that the motion sensor might encounter in real-world applications.

In some embodiments, as the sensor 20 is moved and/or rotated, the testing control device 14 and/or hub 16 monitors the resulting outputs, such as communication between the sensor 20 and hub 16, or outputs/indications from the sensor 20 itself (e.g., audible alerts, visual indications, output RF signals, battery levels, temperature, etc.). The testing control device 14 analyzes these outputs to detect any faults or inconsistencies in the sensor 20's performance, such as false positives or failure to detect the emulated signals (e.g., motion signals, flood/water signals, etc.).

In another example, similar to the motion sensor example, the sensor 20 being tested is a gas sensor designed to detect the presence of one or more specific chemicals in the air, such as carbon monoxide, natural gas, or volatile organic compounds (VOCs). The testing process in this case includes triggering the gas sensor 20 either using a signal input or by simulating the presence of the chemicals in the environment 11.

If the gas sensor 20 includes a debugging or testing pin input specifically configured for being triggered by a particular signal or signal pattern, the testing control device 14 can directly activate the gas sensor 20 without the need for actual exposure to the target chemicals. This feature enables a controlled and efficient testing process.

Alternatively, the testing control device 14 can simulate the presence of the chemicals by introducing chemical samples into the air within the environment 11, either through a controlled release mechanism or by using a chemical generator. This approach provides a more realistic testing scenario by exposing the sensor 20 to actual chemical concentrations it might encounter in real-world applications.

During the testing process, the sensor 20 is moved around and/or rotated within the environment 11 using the mechanical hardware 25 of the sensor testing device 12. This movement simulates various installation positions and orientations that the gas sensor might experience in real-world settings.

As the sensor 20 is moved and/or rotated, the testing control device 14 monitors the resulting outputs, such as communication between the sensor 20 and hub 16, or outputs/indications from the sensor 20 itself. The testing control device 14 analyzes these outputs to detect any faults or inconsistencies in the sensor 20's performance, such as false positives or failure to detect the emulated chemical presence.

In an additional Step S110, the testing control device 14 (and/or sensor testing device 12) may configure the movable barrier 22 to move, rotate, etc., within the environment 11, so as to simulate, e.g., doors, windows, or other obstructions which may affect the signaling between sensor 20 and hub 16, for example. In some embodiments, a variety of movable barriers 22 may be configurable, with varying properties, materials, etc., so as to simulate a variety of obstructions that may be encountered in real-world situations.

In Step S112, the sensor testing device 12 (and/or testing control device 14) may input one or more control signals to sensors 20, e.g., causing the sensor 20 to enter a debugging mode, simulating the presence of motion, water, gas, etc., depending on the sensor 20 type, etc.

In Step S114, the sensor 20 may send signaling to hub 16, e.g., in accordance with the sensor 20's configuration, which may correspond to a typical operation of sensor 20 or a debugging operation of sensor 20. For example, a gas sensor 20 may be configured to signal to hub 16 the presence of detected chemicals in the environment, e.g., based on the input control signals from sensor testing device 12, or based on actual chemicals or simulated chemicals detected in environment 11.

In Step S116, the sensor testing device 12 may measure sensor 20 characteristics during operation, e.g., battery level, signal quality, signal power, audible indications, visual indications, etc.

Similarly, in Step S118, the sensor testing device 12 may measure hub 16 characteristics, e.g., battery level, signal quality (e.g., of signaling received from sensor(s) 20), and other characteristics. Such measurement may include, e.g., exchanging data or other signaling with hub 16. For example, the measurements may be performed by hub 16, which then forwards the measurement data to sensor testing device 12 and/or testing control device 14. In another example, the measurements may be performed by sensor testing device 12.

In Step S120, the measurements may be reported by sensor testing device 12 and/or hub 16 to testing control device 14. For example, while testing the sensor 20, one or more faults may be detected. As these faults are detected, they are associated with the specific testing parameters and the resulting signal output(s) of the sensor 20 and/or hub 16. This association is maintained within an appropriate data structure, such as a database, log file, or any other suitable data storage format, to facilitate further analysis or refinement of the sensor's performance.

The data structure could include, for example, information on the sensor type, the testing conditions (e.g., orientation, position, simulated environment factors), the specific testing parameters (e.g., input signal patterns, simulated chemical concentrations, or motion patterns), and the observed fault(s) (e.g., communication failure, false positives, or false negatives).

In some embodiments, the testing control device 14 may include built-in analytical tools or algorithms that can process the collected data and generate reports, visualizations, or recommendations for improvements. This feature can help streamline the testing and analysis process, making it easier for engineers and designers to address the detected faults and enhance the overall performance of the sensor 20 and/or hub 16.

In some embodiments, based on this analysis, the testing control device 14 may adjust the testing profiles by increasing the frequency, intensity, duration, or complexity of the
identified conditions, positions, or movement patterns that
are more likely to induce faults. This targeted approach to
testing helps focus the evaluation process on areas of
potential concern, ensuring that the sensor 20 is thoroughly
tested under the most challenging circumstances and reveal-
ing any latent issues that might have been overlooked during
earlier testing stages.

In some embodiments, testing control device 14 may also
utilize machine learning algorithms, statistical analysis tech-
niques, or other advanced data processing methods to iden-
tify patterns or correlations within the fault data. These
insights may aid in optimizing the testing profiles, ensuring
that the sensor 20 is rigorously evaluated across a wide range
of realistic operating conditions.

In some embodiments, the sensor testing device 12 may
be configured to generate and/or simulate interference, such
as by transmitting and/or emitting signaling which simulates
background noise and/or the presence of other transmitting
devices in the environment 11. In this way, the performance
of sensor 20 and hub 16 may be measured in the presence of
noise and/or interference, as may be typically experienced in
a real-world environment.

Figure 7:
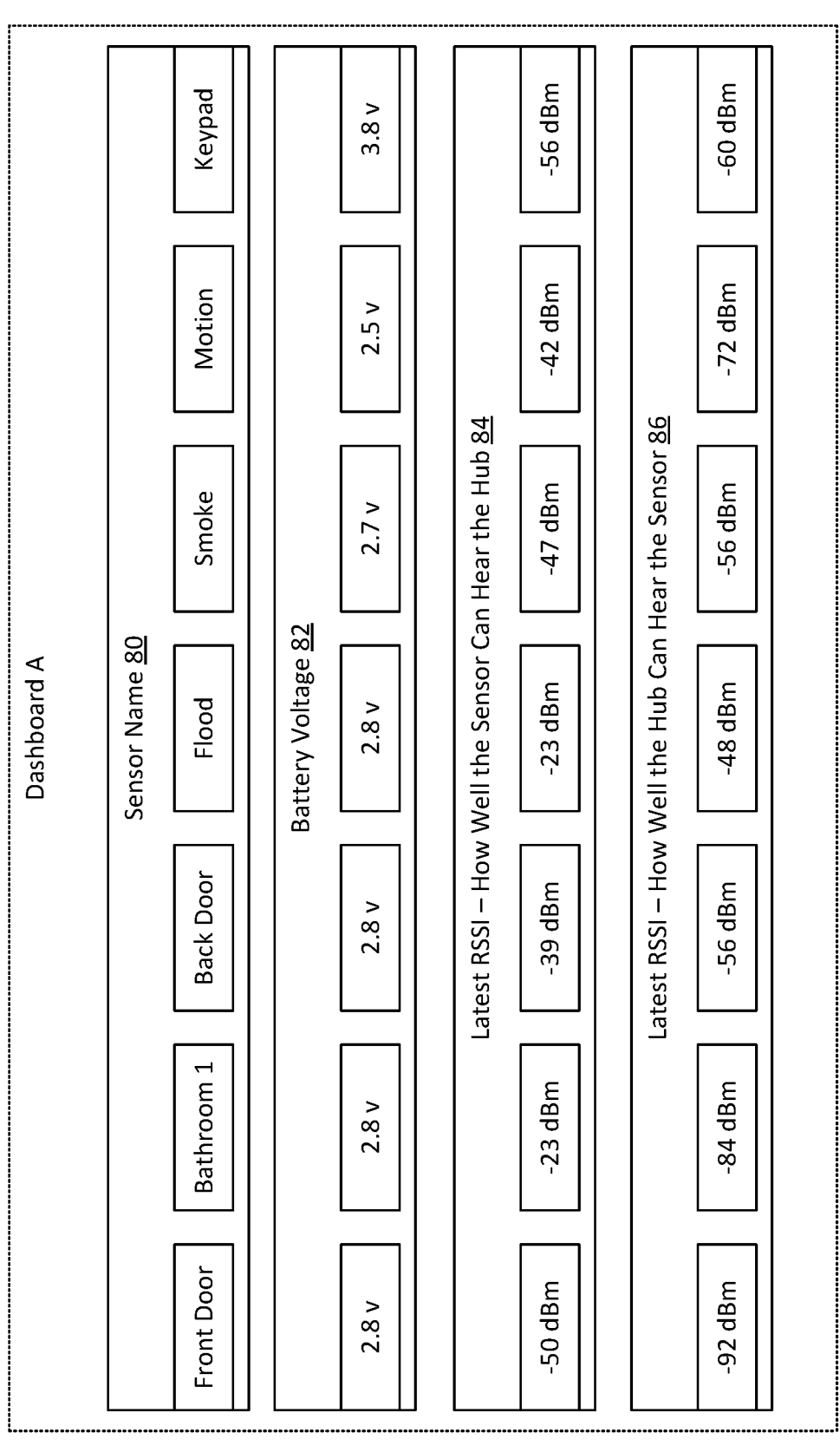
FIG. 7 is a diagram illustrating an example testing user interface according to some embodiments of the present disclosure.

FIG. 7 illustrates an example user interface, e.g., as
implemented by testing control device 14, which provides a
user with comprehensive information regarding the sensors
20 being tested. In panel 80, the sensor 20 identities are
listed, corresponding to sensors 20 being tested. In panel 82,
battery voltage measurement data for each of the corre-
sponding sensors 20 are listed. For example, the front door
sensor 20 has a recorded battery voltage of 2.8 v, while the
keypad sensor 20 has a recorded battery voltage of 3.8 v.
Other measurements may include, e.g., battery usage, power
usage, temperature, etc. In panel 84, the latest received
signal strength indicator (RSSI) corresponding to how well
the sensor can hear signaling from the hub 16 is measured
in decibels. For example, the front door sensor 20 has an
RSSI measurement of signaling from the hub 16 of −50
dBm, while the keypad sensor 20 has an RSSI measurement
of signaling from the hub 16 of −56 dBm. In panel 86, the
latest RSSI corresponding to how well the hub 16 can detect
signaling from each sensor is measured in decibels. For
example, the hub 16 has an RSSI measurement of signaling
from the front door sensor 20 of −92 dBm, while the hub 16
has an RSSI measurement of signaling from the keypad 20
of −60 dBm.

Figure 8:
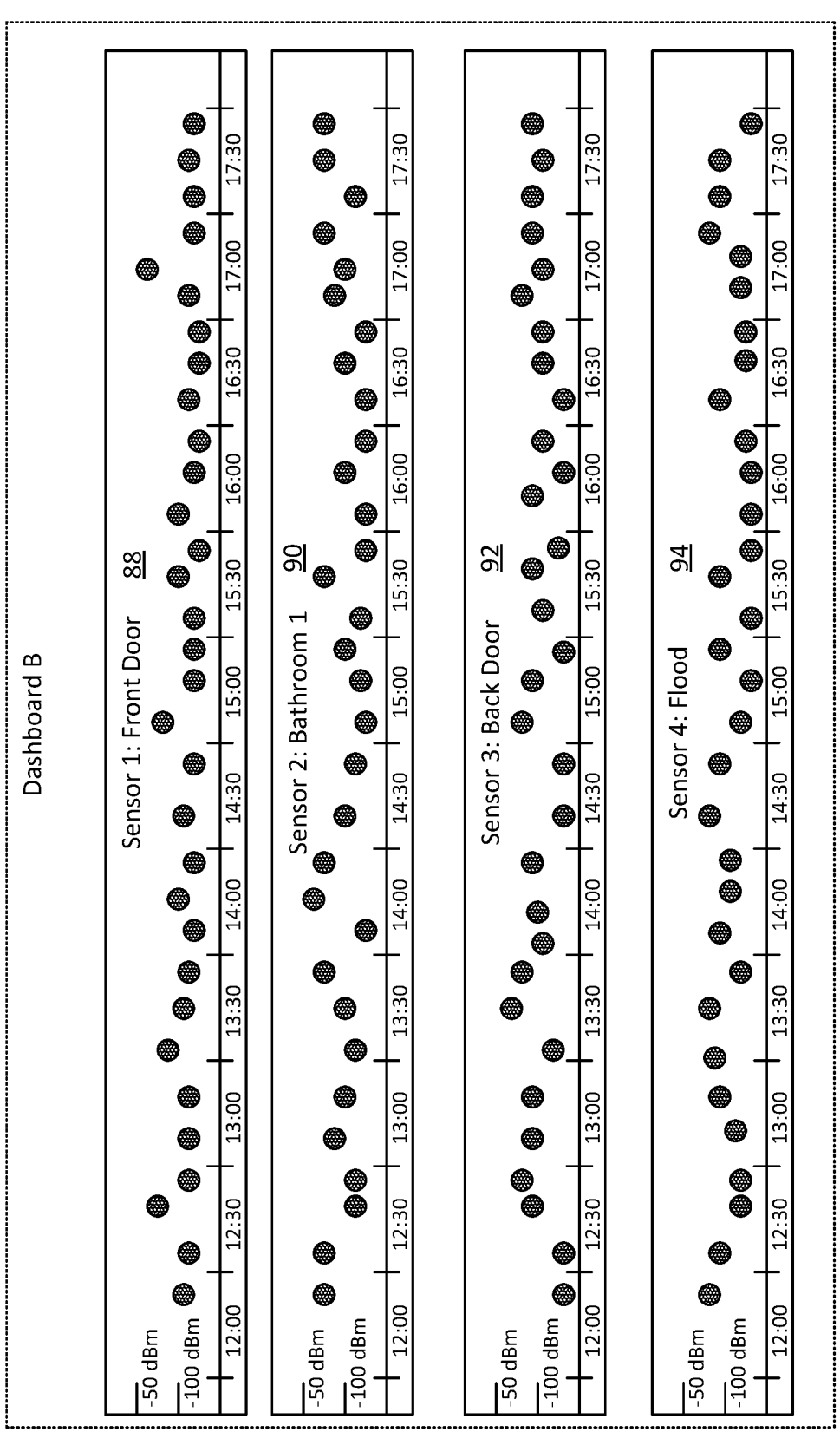
FIG. 8 is a diagram illustrating another example testing user interface according to some embodiments of the present disclosure.

FIG. 8 illustrates another example user interface, e.g., as
implemented by testing control device 14, which provides
historical information for the sensors 20 being tested. In
panel 88, the RSSI measurements for the front door sensor
20 (e.g., corresponding to hub 16 measurements of signaling
from the front door sensor 20) are shown over time, from
12:00 to 17:30. In panel 90, the RSSI measurements for the
bathroom 1 sensor 20 (e.g., corresponding to hub 16 mea-
surements of signaling from the bathroom 1 sensor 20) are
shown over time, from 12:00 to 17:30. In panel 92, the RSSI
measurements for the back door sensor 20 (e.g., correspond-
ing to hub 16 measurements of signaling from the back door
sensor 20) are shown over time, from 12:00 to 17:30. In
panel 94, the RSSI measurements for the flood sensor 20
(e.g., corresponding to hub 16 measurements of signaling
from the flood sensor 20) are shown over time, from 12:00
to 17:30.

Figure 9:
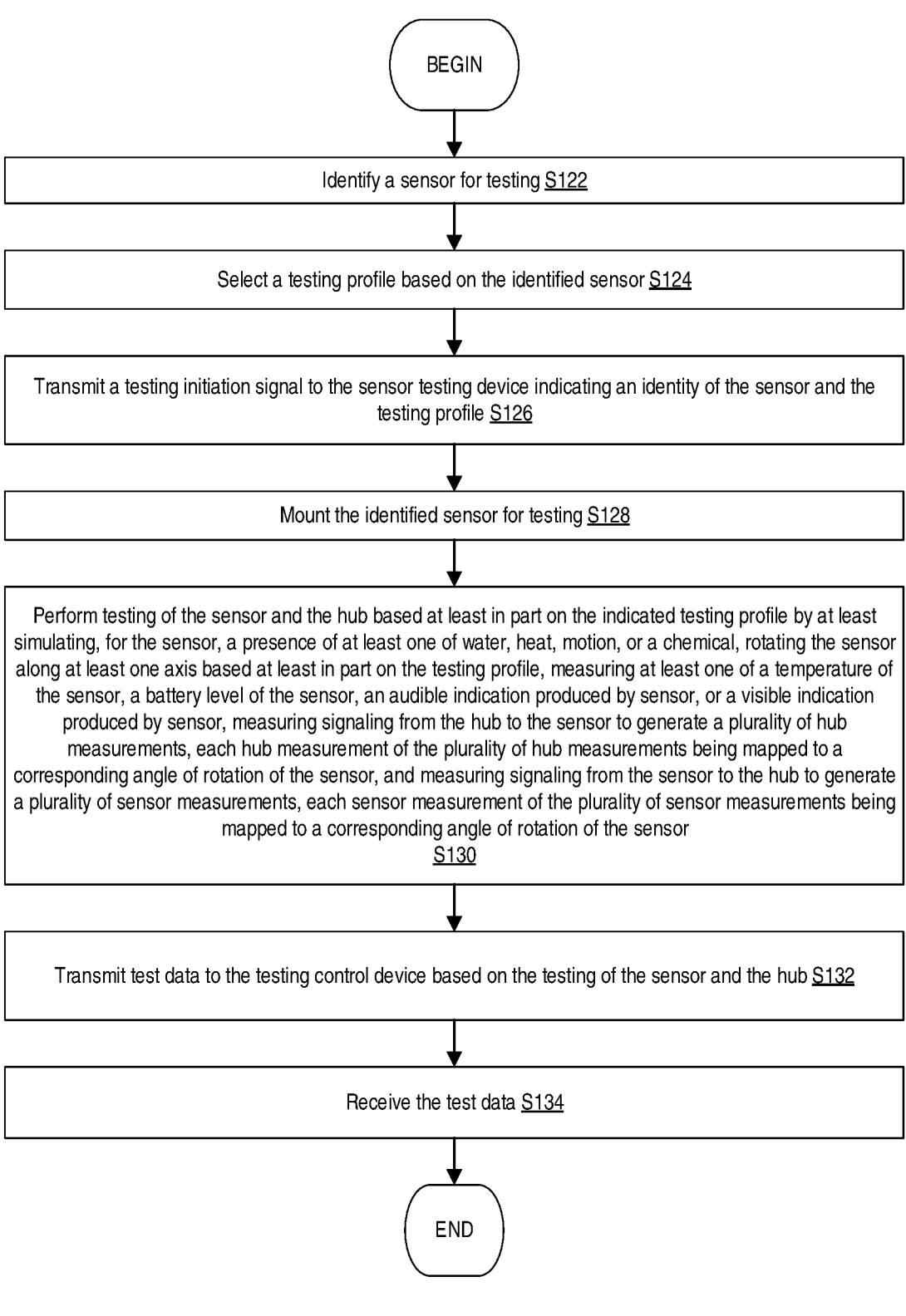
FIG. 9 is a flowchart of an example process in an example system including a sensor testing device and testing control device, according to some embodiments of the present disclosure.

FIG. 9 illustrates a flowchart of an example process (i.e.,
method) implemented in a system 10 by sensor testing
device 12, testing control device 14, hub 16, sensor 20, and
movable barrier 22, according to some embodiments of the present disclosure. One or more steps depicted in FIG. 9 may
be optional in other embodiments.

One or more blocks described herein may be performed
by one or more elements of sensor testing device 12, such as
by one or more of processing circuitry 28, test unit 13,
and/or mechanical hardware 25, and/or communication
interface 26, and by one or more elements of testing control
device 14, such as by one or more of processing circuitry 40,
control unit 15, and/or communication interface 38.

Testing control device 14 is configured to identify (Block
S122) a sensor 20 for testing. Testing control device 14 is
configured to select (Block S124) a testing profile based on
the identified sensor 20. Testing control device 14 is con-
figured to transmit (Block S126) a testing initiation signal to
the sensor testing device 12 indicating an identity of the
sensor 20 and the testing profile. Sensor testing device 12 is
configured to mount (Block S128) the identified sensor 20
for testing. Sensor testing device 12 is configured to perform
testing (Block S130) of the sensor 20 (and, optionally, the
hub 16) based on the indicated testing profile, by at least
simulating, for the sensor 20, a presence of at least one of
water, heat, a motion, or a chemical, rotating the sensor 20
along at least one axis based at least in part on the testing
profile, measuring at least one of a temperature of the sensor
20, a battery level of the sensor, an audible indication
produced by sensor, or a visible indication produced by
sensor, and, measuring signaling from the hub 16 to the
sensor 20 to generate a plurality of hub measurements, each
hub measurement of the plurality of hub measurements
being mapped to a corresponding angle of rotation of the
sensor 20, and measuring signaling from the sensor 20 to the
hub to generate a plurality of sensor measurements, each
sensor measurement of the plurality of sensor measurements
being mapped to a corresponding angle of rotation of the
sensor 20. Sensor testing device 12 is configured to transmit
(Block S132) test data to the testing control device 14 based
on the testing of the sensor 20 (and, optionally, the hub 16).
Testing control device 14 is configured to receive (Block
S134) the test data.

In some embodiments, the sensor testing device 12 is
configured to rotate the sensor along a vertical axis and a
horizontal axis for a plurality of rotations, each of the
plurality of rotations being according to a predefined incre-
ment.

In some embodiments, the sensor 20 is comprised of two
sub-modules, the sensor testing device 12 being configured
to rotate the two sub-modules relative to one another.

In some embodiments, the testing control device 14 is
configured to cause a movable barrier 22 to change position
while performing the testing of the sensor 20, the movable
barrier 22 being disposed between the sensor 20 and the hub
16.

In some embodiments, the testing control device 14 is
configured to cause at least one of a plurality of movable
barriers 22 to change position while performing the testing
of the sensor, the movable barriers 22 being selectively
disposed between the sensor and the hub, each of the
plurality of movable barriers comprising at least one of a
glass material, a cement material, a wood material, a metal
material, a plastic material, and a drywall material. For
example, the testing control device 14 may, based at least in
part on the testing profile, place a concrete movable barrier
22 between the sensor 20 and the hub during a first testing
period, then remove the concrete movable barrier 22 and put
in place a glass movable barrier 22 between the sensor 20
and hub 16 during a second testing period, and then during a third testing period, place both the concrete movable barrier 22 and the glass movable barrier 22 between the sensor 20 and hub 16.

In some embodiments, the sensor testing device 12 is configured to cause transmission of simulated interference signals.

In some embodiments, the sensor testing device 12 is configured to measure at least one of a temperature of the sensor 20, a battery level (e.g., voltage level, capacity, current, etc.) of the sensor 20, an audible indication produced by sensor 20, or a visible indication produced by sensor 20.

The concepts described herein may be embodied as a method, data processing system, computer program product and/or computer storage media storing an executable computer program. Accordingly, the concepts described herein may take the form of an entirely hardware embodiment, an entirely software embodiment or an embodiment combining software and hardware aspects. Any process, step, action and/or functionality described herein may be performed by, and/or associated to, a corresponding module and/or unit, which may be implemented in software and/or firmware and/or hardware. Furthermore, the disclosure may take the form of a computer program product on a tangible computer usable storage medium having computer program code embodied in the medium that can be executed by a computer. Any suitable tangible computer readable medium may be utilized including hard disks, CD-ROMs, electronic storage devices, optical storage devices, or magnetic storage devices.

Some embodiments are described herein with reference to flowchart illustrations and/or block diagrams of methods, systems and computer program products. Each block of the flowchart illustrations and/or block diagrams, and combinations of blocks in the flowchart illustrations and/or block diagrams, can be implemented by computer program instructions. These computer program instructions may be provided to a processor of a general purpose computer (to thereby create a special purpose computer), special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable memory or storage medium that can direct a computer or other programmable data processing apparatus to function in a particular manner, such that the instructions stored in the computer readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Computer program code for carrying out operations of the concepts described herein may be written in an object oriented programming language such as Python, Java® or C++. However, the computer program code for carrying out operations of the disclosure may also be written in conventional procedural programming languages, such as the "C" programming language. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

Many different embodiments have been disclosed herein, in connection with the above description and the drawings. It would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In addition, unless mention was made above to the contrary, the accompanying drawings are not to scale. A variety of modifications and variations are possible in light of the above teachings without departing from the scope and spirit of the present disclosure.

What is claimed is:

1. A system for testing a sensor and a hub, the system comprising:

a testing control device and a sensor testing device configured to communicate with the testing control device, the testing control device comprising:

at least one processor; and at least one computer-readable medium storing a plurality of instructions that, when executed by the at least one processor, cause the at least one processor to:

identify the sensor for testing;

select a testing profile based at least in part on the identified sensor; and cause transmission of a testing initiation signal to the sensor testing device indicating an identity of the sensor and the testing profile;

the sensor testing device comprising:

at least one processor; and at least one computer-readable medium storing a plurality of instructions that, when executed by the at least one processor, cause the at least one processor to:

cause a mounting of the identified sensor for testing;

perform testing of the sensor and the hub based at least in part on the testing profile by at least:

simulating, for the sensor, a presence of at least one of water, heat, motion, or a chemical;

rotating the sensor along at least one axis based at least in part on the testing profile;

measuring at least one of a temperature of the sensor, a battery level of the sensor, an audible indication produced by sensor, or a visible indication produced by sensor;

measuring signaling from the hub to the sensor to generate a plurality of hub measurements, each hub measurement of the plurality of hub measurements being mapped to a corresponding angle of rotation of the sensor; and measuring signaling from the sensor to the hub to generate a plurality of sensor measurements, each sensor measurement of the plurality of sensor measurements being mapped to a corresponding angle of rotation of the sensor; and cause transmission of a test data to the testing control device based at least in part on the testing of the sensor and the hub; and the at least one computer-readable medium of the testing control device further stores instructions that, when executed, further cause the at least one processor of the testing control device to receive the test data from the sensor testing device.

2. The system of claim 1, wherein the at least one computer-readable medium of the sensor testing device further stores instructions that, when executed, further cause the at least one processor of the sensor testing device to rotate the sensor along a vertical axis and a horizontal axis for a plurality of rotations, each of the plurality of rotations being according to a predefined increment.

3. The system of claim 1, wherein the sensor and the hub are configured to communicate with each other.

4. The system of claim 3, wherein the testing profile corresponds to an operating condition of the sensor and the hub to be tested.

5. The system of claim 4, wherein performing testing of the sensor and the hub based at least in part on the testing profile further comprises simulating the operating condition of the sensor and the hub and generating test data based on the simulation of the operating condition.

6. The system of claim 5, wherein simulating the operating condition further comprises transmitting at least one of a simulated interference signal or a simulated noise signal.

7. The system of claim 5, further comprising at least one movable barrier that is disposed between the sensor and the hub; and wherein simulating the operating condition further comprises causing the at least one movable barrier to change position while performing the testing of the sensor.

8. The system of claim 5, wherein simulating the operating condition further comprises causing at least one movable barrier to change position while performing the testing of the sensor.

9. The system of claim 8, wherein each movable barrier comprises at least one of a glass material, a cement material, a wood material, a metal material, a plastic material, or a drywall material.

10. The system of claim 1, wherein rotating the sensor along at least one axis based on at least in part of the testing profile further comprises rotating the sensor along a first axis for a plurality of rotations, each of the plurality of rotations being according to a predefined increment.

11. The system of claim 1, wherein the sensor comprises two sub-modules; and the at least one computer-readable medium of the sensor testing device further stores instructions that, when executed, further cause the at least one processor of the sensor testing device to rotate the two sub-modules relative to one another.

12. A system for testing a sensor and a hub, the system comprising:

a testing control device and a sensor testing device configured to communicate with the testing control device, the testing control device comprising:

at least one processor; and at least one computer-readable medium storing instructions that, when executed, cause the at least one processor to:

select a testing profile based at least in part on the sensor; and cause transmission of a testing initiation signal to the sensor testing device based at least in part on the testing profile;

the sensor testing device comprising:

at least one processor; and at least one computer-readable medium storing instructions that, when executed, cause the at least one processor to:

perform testing of the sensor and the hub in response to the testing initiation signal, the testing comprising rotating the sensor along at least one axis based at least in part on the testing profile; and cause transmission of test data to the testing control device based at least in part on the testing of the sensor and the hub; and the at least one computer-readable medium of the testing control device further stores instructions that, when executed, further cause the at least one processor of the testing control device to receive the test data from the sensor testing device.

13. The system of claim 12, wherein the at least one computer-readable medium of the sensor testing device further stores instructions that, when executed, further cause the at least one processor of the sensor testing device to rotate the sensor along a first axis for a plurality of rotations, each of the plurality of rotations being according to a predefined increment.

14. The system of claim 12, wherein the at least one computer-readable medium of the sensor testing device further stores instructions that, when executed, further cause the at least one processor of the sensor testing device to generate a plurality of measurements associated with at least one of signaling from the hub to the sensor or signaling from the sensor to the hub, each measurement of the plurality of measurements being mapped to a corresponding angle of rotation of the sensor.

15. The system of claim 12, wherein the sensor comprises two sub-modules; and the at least one computer-readable medium of the sensor testing device further stores instructions that, when executed, further cause the at least one processor of the sensor testing device to rotate the two sub-modules relative to one another.

16. The system of claim 12, wherein the at least one computer-readable medium of the sensor testing device further stores instructions that, when executed, further cause the at least one processor of the sensor testing device to simulate, for the sensor, a presence of at least one of water, heat, motion, or a chemical.

17. The system of claim 12, wherein the at least one computer-readable medium of the testing control device further stores instructions that, when executed, further cause the at least one processor of the testing control device to cause a movable barrier to change position while performing the testing of the sensor, the movable barrier being disposed between the sensor and the hub.

18. The system of claim 12, wherein the at least one computer-readable medium of the testing control device further stores instructions that, when executed, further cause the at least one processor of the testing control device to cause at least one of a plurality of movable barriers to change position while performing the testing of the sensor, each of the plurality of movable barriers comprising at least one of a glass material, a cement material, a wood material, a metal material, a plastic material, or a drywall material.

19. The system of claim 12, wherein the at least one computer-readable medium of the sensor testing device further stores instructions that, when executed, further cause the at least one processor of the sensor testing device to cause transmission of at least one of a simulated interference signal or a simulated noise signal.

20. The system of claim 12, wherein the at least one computer-readable medium of the sensor testing device further stores instructions that, when executed, further cause the at least one processor of the sensor testing device to measure at least one of a temperature of the sensor, a battery level of the sensor, an audible indication produced by sensor, or a visible indication produced by sensor.

* * * * *